United States Patent [19]

Yamazaki

[11] Patent Number: 4,988,634
[45] Date of Patent: Jan. 29, 1991

[54] METHOD FOR FORMING FET WITH A SUPER LATTICE CHANNEL

[75] Inventor: Shunpei Yamazaki, Tokyo, Japan

[73] Assignee: Semiconductor Energy Laboratory Co., Ltd., Kanagawa, Japan

[21] Appl. No.: 512,026

[22] Filed: Apr. 16, 1990

Related U.S. Application Data

[60] Continuation of Ser. No. 301,135, Jan. 25, 1989, abandoned, which is a division of Ser. No. 102,841, Sep. 30, 1987, abandoned.

[30] Foreign Application Priority Data

Oct. 8, 1986 [JP] Japan ............... 61-240544
Oct. 8, 1986 [JP] Japan ............... 61-240545
Oct. 8, 1986 [JP] Japan ............... 61-240546

[51] Int. Cl.$^5$ ............... H01L 21/268; H01L 21/335
[52] U.S. Cl. ............... 437/41; 437/40; 437/110; 437/907; 437/19; 148/DIG. 90; 148/DIG. 91; 148/DIG. 160
[58] Field of Search ............... 437/110, 907, 936, 943, 437/19, 40, 41; 148/DIG. 48, DIG. 93, DIG. 97, DIG. 160, DIG. 90, DIG. 91, DIG. 94, DIG. 4; 357/23.1

[56] References Cited

U.S. PATENT DOCUMENTS

| | | | |
|---|---|---|---|
| 4,194,935 | 3/1980 | Dingle et al. | 148/DIG. 160 |
| 4,661,829 | 4/1987 | Bean et al. | 357/23.2 |
| 4,689,646 | 8/1987 | Matsumoto et al. | 357/4 |
| 4,697,197 | 9/1987 | Dresner | 357/23.2 |
| 4,792,832 | 12/1988 | Baba et al. | 437/110 |

FOREIGN PATENT DOCUMENTS

| | | | |
|---|---|---|---|
| 0109283 | 6/1985 | Japan . | |
| 0133719 | 7/1985 | Japan | 148/DIG. 94 |
| 61-27681 | 2/1986 | Japan . | |
| 0027681 | 2/1986 | Japan . | |

OTHER PUBLICATIONS

Kamins, "Surface Stabilization of Polycrystalline-Silicon Films During Laser Recrystallization", J. Electrochem. Soc. 8/81, vol. 128, No. 8, pp. 1824–1826.

Bean, "Epitaxial Laser Crystallization of Thin Film Amorphous Silicon", Appl. Phys. Lett., vol. 33, No. 3, 8/78, pp. 227–229.

Lasky, "Effects of Various Encapsulating Films on Laser Recrystallization of Silicon on $SiO_2$", J. Appl. Phys. 53 (12), 12/82, pp. 9038–9042.

Kimura, "Strong <100> Texture Formation of Poly Silicon Films on Amorphous Insulators by Laser Recrysallization", Appl. Phys. Lett. 45(8), 10/84, pp. 954–856.

Primary Examiner—Brian E. Hearn
Assistant Examiner—Tuan Nguyen
Attorney, Agent, or Firm—Sixbey, Friedman, Leedom & Ferguson

[57] ABSTRACT

An improved FET is disclosed. The transistor is characterized in that its channel is constituted in the form of a super lattice. The super lattice structure provides a number of square well potential areas through which carriers can pass with little interaction with the gate insulating film.

1 Claim, 3 Drawing Sheets

FIG.I(A)
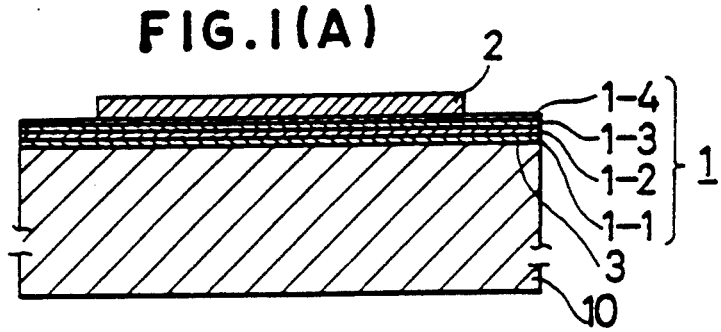
FIG.I(B)
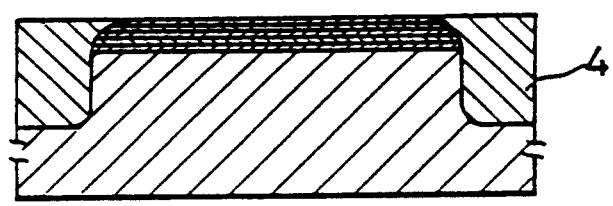
FIG.I(C)
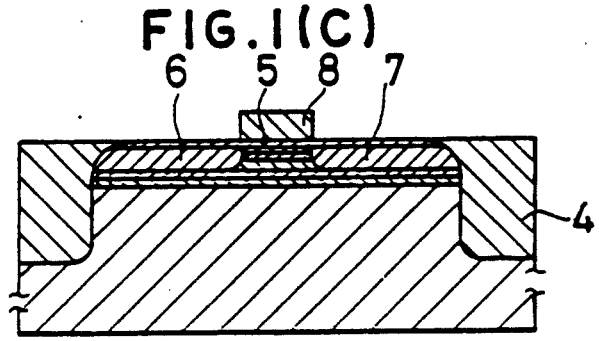
FIG.I(D)
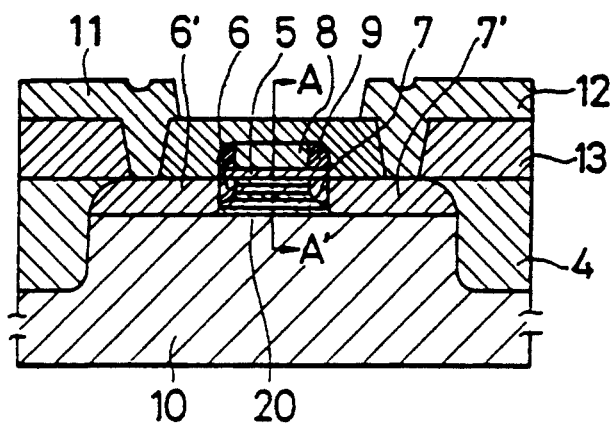

METHOD FOR FORMING FET WITH A SUPER LATTICE CHANNEL

This application is a continuation of Ser. No. 07/301,135, filed Jan. 25, 1989, now abandoned.

BACKGROUND OF THE INVENTION

This invention relates to a field effect transistor (FET) provided with a super lattice channel.

Insulated gate field effect transistors (IGFET) are semiconductor devices which are suitable for high-speed switching operation. Such a transistor comprises a source region, a gate region, a drain region, each region being formed within a single-crystalline silicon semiconductor, and an electrode arragement therefor. The source and drain regions are fabricated by ion doping by which the threshold voltage can be controlled. In such a conventional structure, carrier flow in on-state is limited to a very thin region contiguous to the gate insulated film, so that the mobilities of the electron and the hole are only about 300 $cm^2V/sec$ and 150 $cm^2V/sec$ due to interfacial scattering. Furthermore, in the way of seeking high density of integrated circuits, a short channel length is desired and therefore the concentration of carriers must be made high. Because of this, the mobilities again becomes low.

SUMMARY OF THE INVENTION

It is therefore an object of the invention to Provide a gate insulated FET suitable for application to high speed switching.

It is another object of the invention to provide a gate insulating FET in which punch through breakdown is not likely.

In order to accomplish the above objects, according to the invention, a super lattice structure is formed below a gate insulating film as a channel region. In this structure, carriers pass through a plurality of wells (in the form of sequential square well potentials) so that the carriers are little affected from the interface between the channel region and the gate insulating film. Because of this, even though the channel is made from a substantially intrinsic semiconductor, the curvature of the energy band is comparable to that made from a conventional inpurity semiconductor.

BRIEF DESCRIPTION OF THE DRAWINGS

FIGS. 1(A) through 1(D) are cross-sectional views showing the process of manufacturing a gate insulating FET in accordance with the present invention.

DETAILED DESCRIPTION OF THE PREFERRED EMBODIMENTS

Figure 2A:
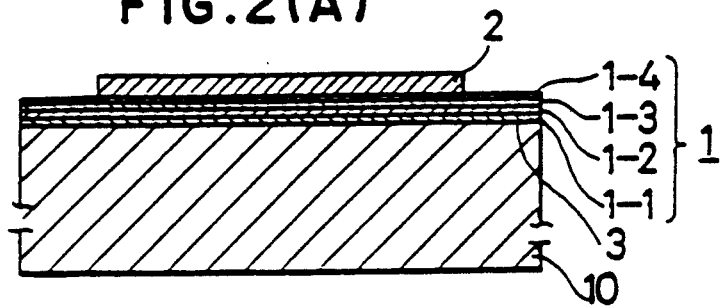
FIGS. 2(A) through 2(D) are cross-sectional views showing the process of manufacturing another embodimant of the present invention.
Figure 2B:
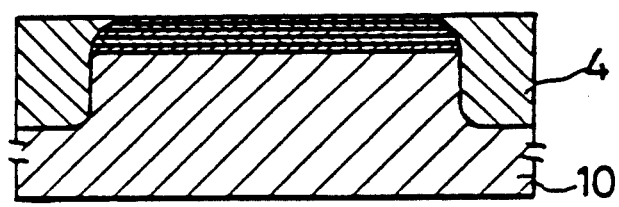
Figure 2C:
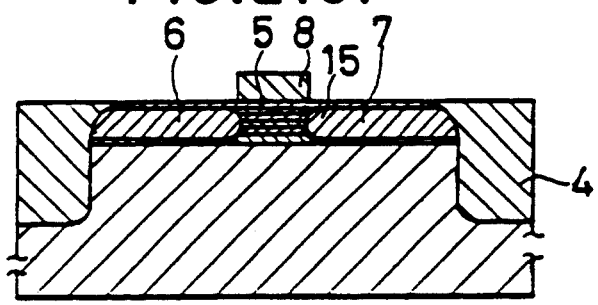
Figure 2D:
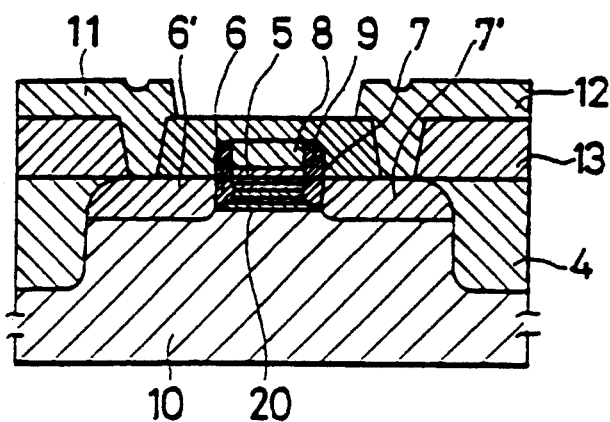

Referring to FIGS. 1(A) through 1(D), a gate insulated FET is explained according to its manufacturing method. On a single-crystalline silicon semiconductor substrate whose upper surface is sufficiently cleaned, 25Å thick silicon semiconductor film and 25Å thick silicon nitride ($Si_3N_{4-x}$ $0<x<1$) film are deposited in turn so that the two kinds of films are superimposed one on another for 2–50 times in a super lattice structure. The deposition is carried out with "hv-1", the trademark of a photo enhanced CVD apparatus distributed by Semiconductor Energy Laboratory Co., Ltd. Namely, disilan gas is introduced into a reaction chamber at 10 Torr and irradiated with ultraviolet light (185 nm in wavelength) emitted from a low pressure mercury lamp, whereupon a 25Å thick silicon semiconductor film is deposited on the substrate which is heated to 200°–500° C., e.g., 400° C. Then, under the control of a microcomputor, a mixture gas, $NH_3/Si_2H_6=0.1$–$1.0$ (e.g., 0.3), is introduced into the reaction chamber and processed in the same manner so that a silicon nitride film is deposited with 25Å in thickness. The thickness of the silicon nitride film may be between 10–100Å (e.g., 25Å). These deposition steps are carried out repeatedly and a super lattice structure is fabricated. Next, the super lattice 1 formed within the substrate 10 is annealed with a nitrogen laser beam in hydrogen atmospher. By this annealing, the semiconductor films 1—1, 1-3, . . . 1-n are crystallized into single crystalline layers in virtue of the single crystalline structure of the substrate 10. The silicon nitride film 1-2, 1-4, . . . 1-(n-1) are crystallized into single crystalline layers, distorted crystalline layers, or non-single-crystalline layers, depending on the proportion of nitrogen to silicon.

On the super lattice 1, a mask 2 is placed, and the lattice and the substrate 10 is partially removed by anisotoropic etching. An insulating materal 4 is deposited into the etched portions by an existing method which is used for forming a trench structure. After taking out the mask 2, a gate insulating film 5 and a gate electrode are formed. The gate insulating film is formed of silicon oxide by a photo enhanced CVD. The gate electrode is made of $WSi_2$, $TiSi_2$, or a semiconductor-metal multi-layer structure.

Then, a source region 6 and a drain region 7 are formed by ion inplantation. The impurity densities of the source and drain regions are about $10^{17}$–$10^{19}$ $cm^{-3}$. The interfaces of these region 6 and 7 adjacent to the super lattice 1 are desired normal to the principal surface. Over the source and drain regions 6 and 7 and the gate electrode 5, a silicon oxide layer is deposited on the substrate with 0.5 micron in thickness by a photo CVD using $SiH_4$ and $O_2$. The silicon oxide layer is anisotropically etched and removed by electron cyclotron resonance, except for the portion 9 on the peripheral side surface of the gate electrode 8.

Further, regions 6' and 7' for providing ohmic contacts and for making the sheet resistance of the source and the drain low are formed by a high density ion implantation at $1\times10^{19}$–$2\times10^{20}$ $cm^{-3}$, followed by thermal annealing. After covering the upper surface with an insulating layer 13, a source electrode 11 and a drain electrode 12 are formed in contact with the source contact region 6' and the drain contact region 7' through openings formed on the insulating layer 13. The electrodes 11 and 12 are formed of an aluminium layer by known methods. The channel length of the FET thus formed is one micron.

The characteristics of a FET which had been manufactured by the above explained method with such doping levels required for controlling the threshold voltage were measured. No punch through was observed even when 5 V was applied betweem the source and the drain. The carrier mobility calculated in accordance with the C.T.Sah's fomula was 750 $cm^2V/sec$. This figure is 2.5 times as large as the conventional figure, 300 cm²V/sec. The improved mobility increases further as the crystallinity of the super lattice is improved.

Figure 3A:
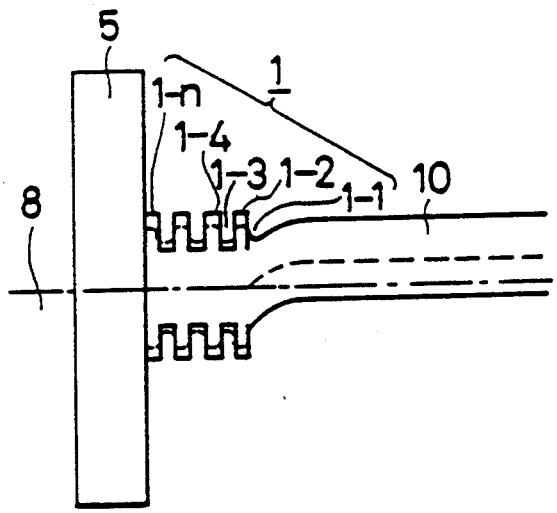
FIGS. 3(A) and 3(B) are energy band diagrams of a gate insulating FET in accordance with the present invention.
Figure 3B:
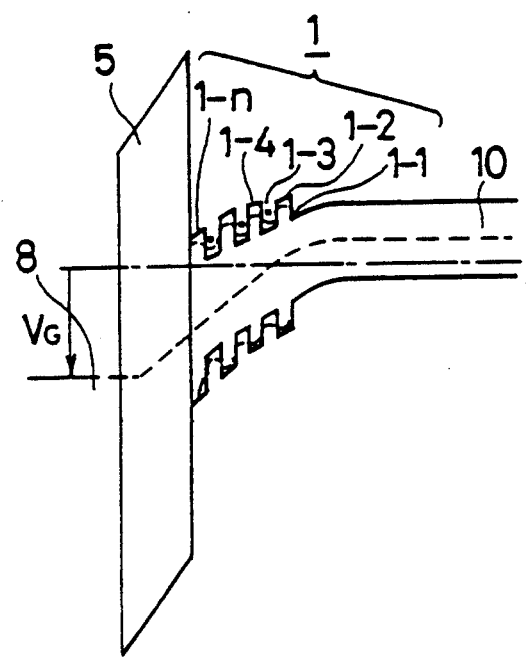

FIGS. 3(A) and 3(B) are energy diagrams taken across the A—A' line of FIG. 1(D) showing energy bands of the device formed in accordance with the above method. As seen from FIG. 3(A), there are a number of regions, apart from the gate insulating film 5, where carriers flock and can exist stably. Although the diagram is changed under a gate voltage $V_G$, the carrier passages remain apart form the gate insulating film as illustrated in FIG. 3(B). Namely, it is avoided that carriers are concentrated a very near region contiguous to the insulating film 5.

Referring to FIGS. 2(A) through 2(D), a second embodiment is illustrated. Of the Figures, FIGS. 2(A) and 2(B) and their corresponding description the same as the preceding embodiment, so that no redundant explanation is repeated. In this embodiment, source and drain regions 6 and 7 are formed so that the impurity density is higher at a deeper position. Because of this, the channel length between the source and the drain becomes longer as the gate insulating film 5 is approached. And the carrier can drift easily at an inner region as compared with a shallow region so that the influence of interfacial diffusion is reduced. The carrier mobility was improved to 850 cm²V/sec. The other manufacturing conditions are same as in the preceding embodiment.

A third embodiment is directed to another forming method of such devices as illustrated in FIGS. 1(A) to 1(D) or in FIGS. 2(A) to 2(D). The super lattice 1 is fabricated by photo epitaxial growth. Namely, with the same apparatus used for the first embodiment, $Si_2H_6$ and $H_2SiF_2$ are introduced into the reaction chamber almost at a same rate. In addition, hydrogen gas is introduced at a rate 20 times as high as that of $Si_2H_6$. The substrate temperature is 500° C. The reaction pressure is 10 Torr. Other processes are the same as those of the first embodiment. Photo CVD and photo epitaxial growth are excellent in forming thin films with 5–100 Å, e.g., 10–30 Å repeatedly without damaging underlying surfaces.

The invention should not limited to the above particular embodiments and many modifications and variations may be made by those skilled in the art. For example, in place of silicon nitride films, $SiO_{2-x}(0<x<0)$ or $Si_xC_{1-x}(0<x<1)$ can be used.

I claim:
1. A method for forming FET's comprising
   forming a first wide-energy-gap semiconductor thin film on a substrate;
   forming a second narrow-energy-gap semiconductor thin film on said first semiconductor thin film;
   repeating the forming steps of said first and second semiconductor thin films alternately into a superlattice structure;
   forming source and drain regions which are separated from each other by a channel region constituted by said superlattice structure;
   forming a gate insulating film on said channel region;
   wherein said first and second semiconductor thin films are formed by photo CVD and said superlattice structure is laser annealed to enhance the crystallinity of said superlattice structure.

* * * * *